(12) United States Patent
    Jo

(10) Patent No.: US 10,847,229 B2
(45) Date of Patent: Nov. 24, 2020

(54) MEMORY DEVICE DETECTING MULTIPLE PROGRAM STATES AND OPERATING METHOD THEREOF

(71) Applicant: SK hynix Inc., Gyeonggi-do (KR)

(72) Inventor: Kang Wook Jo, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/139,627

(22) Filed: Sep. 24, 2018

(65) Prior Publication Data

US 2019/0237145 A1    Aug. 1, 2019

(30) Foreign Application Priority Data

Jan. 30, 2018  (KR) .......................... 10-2018-0011543

(51) Int. Cl.
    *G11C 16/26*      (2006.01)
    *G11C 11/56*      (2006.01)
    *G11C 16/04*      (2006.01)
    *G11C 16/34*      (2006.01)

(52) U.S. Cl.
    CPC .......... *G11C 16/26* (2013.01); *G11C 11/5642* (2013.01); *G11C 16/0483* (2013.01); *G11C 16/3459* (2013.01)

(58) Field of Classification Search
    CPC . G11C 11/5642; G11C 11/5671; G11C 16/10; G11C 16/28; G11C 16/08; G11C 29/021; G11C 29/028; G11C 29/52
    See application file for complete search history.

(56) References Cited

U.S. PATENT DOCUMENTS

| | | | |
|---|---|---|---|
| 9,042,175 B2* | 5/2015 | Sim | G11C 16/26 365/185.03 |
| 9,418,747 B2* | 8/2016 | Kang | G11C 16/26 |
| 10,304,544 B2* | 5/2019 | Park | G11C 11/5642 |
| 2017/0133087 A1* | 5/2017 | Park | G11C 11/5642 |

FOREIGN PATENT DOCUMENTS

| KR | 101046805 | 7/2011 |
|---|---|---|
| KR | 1020140148133 | 12/2014 |

* cited by examiner

*Primary Examiner* — Vanthu T Nguyen
(74) *Attorney, Agent, or Firm* — IP & T Group LLP

(57) ABSTRACT

There are provided a memory device and an operating method thereof. The memory device includes: a memory cell; a bit line and a word line, coupled to the memory cell; and a page buffer configured to perform a read operation on the memory cell, wherein the page buffer senses a program state of the memory cell as one of at least three program states by performing a first evaluation operation, a first sensing operation, a second evaluation operation, and a second sensing operation when one read voltage is applied to the word line during the read operation.

23 Claims, 11 Drawing Sheets

MEMORY DEVICE DETECTING MULTIPLE PROGRAM STATES AND OPERATING METHOD THEREOF

CROSS-REFERENCE TO RELATED APPLICATION

The present application claims priority under 35 U.S.C. § 119(a) to Korean patent application number 10-2018-0011543, filed on Jan. 30, 2018, the entire disclosure of which is incorporated herein by reference.

BACKGROUND

Field of Invention

Various embodiments of the present disclosure generally relate to a memory device and an operating method thereof. Particularly, to a memory device capable of improving the speed of a read operation and an operating method of the memory device.

Description of Related Art

A semiconductor memory device is a storage device implemented using a semiconductor such as silicon (Si), germanium (Ge), gallium arsenide (GaAs), or indium phosphide (InP). The semiconductor memory device is generally classified into a volatile memory device and a nonvolatile memory device.

The volatile memory device loses stored data when the power supply is cut off. Examples of the volatile memory include a static random access memory (SRAM), a dynamic RAM (DRAM), a synchronous DRAM (SDRAM), and the like. The nonvolatile memory device retains stored data even when the supply of power is cut off. Examples of the nonvolatile memory include a read only memory (ROM), a programmable ROM (PROM), an electrically programmable ROM (EPROM), an electrically erasable and programmable ROM (EEPROM), a flash memory, a phase-change RAM (PRAM), a magnetic RAM (MRAM), a resistive RAM (RRAM), a ferroelectric RAM (FRAM), and the like. The flash memory is generally classified into a NOR type flash memory and a NAND type flash memory.

SUMMARY

Embodiments provide a memory device capable of improving the speed of a read operation and a program verify operation, and an operating method of the memory device.

According to an aspect of the present disclosure, there is provided a memory device including: a memory cell; a bit line and a word line, coupled to the memory cell; and a page buffer configured to perform a read operation on the memory cell, wherein the page buffer senses a program state of the memory cell as one of at least three program states by performing a first evaluation operation, a first sensing operation, a second evaluation operation, and a second sensing operation when one read voltage is applied to the word line during the read operation.

According to another aspect of the present disclosure, there is provided a method for operating a memory device, the method including: precharging a bit line coupled to a memory cell, and applying a first read voltage to a word line coupled to the memory cell; performing a pre-evaluation operation by controlling a potential level of a sense node in a page buffer according to a potential level of the bit line, wherein potentials of the bit line and a common node are evaluated in response to a first sensing signal having a first potential level, and potentials of the common node and the sense node are evaluated in response to a second sensing signal having a second potential level; performing a first sensing operation by sensing first data corresponding to the potential level of the sense node; performing a post-evaluation operation by maintaining the first read voltage applied to the word line, and controlling the potential level of the sense node according to the potential level of the bit line, wherein the potentials of the bit line and the common node are evaluated in response to the first sensing signal having the first potential level, and the potentials of the common node and the sense node are evaluated in response to the second sensing signal having a third potential level; and performing a second sensing operation by sensing second data corresponding to the potential level of the sense node.

According to still another aspect of the present disclosure, there is provided a method for operating a memory device, the method including: precharging a bit line coupled to a memory cell, and applying a main verify voltage to a word line coupled to the memory cell; performing a pre-evaluation operation by controlling a potential level of a sense node in a page buffer according to a potential level of the bit line, wherein potentials of the bit line and a common node are evaluated in response to a first sensing signal having a first potential level, and potentials of the common node and the sense node are evaluated in response to a second sensing signal having a second potential level; performing a pre-verify operation according to the potential level of the sense node by performing a first sensing operation; performing a post-evaluation operation by maintaining the main verify voltage applied to the word line, and controlling the potential level of the sense node according to the potential level of the bit line, wherein the potentials of the bit line and the common node are evaluated in response to the first sensing signal having the first potential level, and the potentials of the common node and the sense node are evaluated in response to the second sensing signal having a third potential level; and performing a main verify operation according to the potential level of the sense node by performing a second sensing operation.

BRIEF DESCRIPTION OF THE DRAWINGS

Various embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey the scope of the example embodiments to those skilled in the art. It is noted that reference to "an embodiment" does not necessarily mean only one embodiment, and different references to "an embodiment" are not necessarily to the same embodiment(s).

In the drawings, dimensions of the figures may be exaggerated for clarity of illustration. It will be understood that when an element is referred to as being "between" two elements, it can be the only element between the two elements, or one or more intervening elements may also be present. Like reference numerals refer to like elements throughout.

DETAILED DESCRIPTION

In the following detailed description, only certain exemplary embodiments of the present disclosure have been shown and described, simply by way of illustration. As those skilled in the art would realize, the described embodiments may be modified in various different ways, all without departing from the spirit or scope of the present disclosure. Accordingly, the drawings and description are to be regarded as illustrative in nature and not restrictive.

In the entire specification, when an element is referred to as being "connected" or "coupled" to another element, it can be directly connected or coupled to the another element or be indirectly connected or coupled to the another element with one or more intervening elements interposed therebetween. In addition, when an element is referred to as "including" a component, this indicates that the element may further include another component instead of excluding another component unless there is different disclosure.

Figure 1:
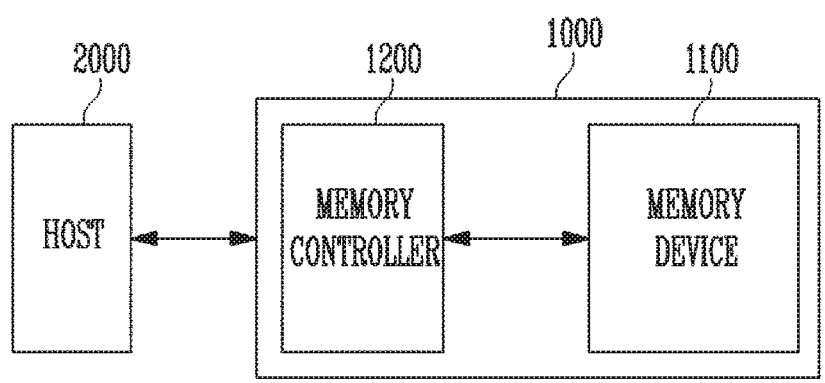
FIG. 1 is a diagram illustrating a memory system according to an embodiment of the present disclosure.

FIG. 1 is a diagram illustrating a memory system 1000 according to an embodiment of the present disclosure.

Referring to FIG. 1, the memory system 1000 may include a memory device 1100 for storing data and a memory controller 1200 for controlling the memory device 1100 under the control of a host 2000.

The host 2000 may communicate with the memory system 1000 by using an interface protocol such as Peripheral Component Interconnect-Express (PCI-E), Advanced Technology Attachment (ATA), Serial ATA (SATA), Parallel ATA (PATA), or Serial Attached SCSI (SAS). Interface protocols between the host 2000 and the memory system 1000 are not limited to the above-described examples, and may be one of other interface protocols such as a Universal Serial Bus (USB), a Multi-Media Card (MMC), an Enhanced Small Disk Interface (ESDI), and Integrated Drive Electronics (IDE).

The memory controller 1200 may control the overall operations of the memory system 1000, and control data exchange between the host 2000 and the memory device 1100. For example, the memory controller 1200 may program or read data by controlling the memory device 1100 in response to a request from the host 2000. Also, the memory controller 1200 may store information of main memory blocks and sub-memory blocks, which are included in the memory device 1100, and select the memory device 1100 to perform a program operation on a main memory block or a sub-memory block according to the amount of data loaded for the program operation. Depending on an embodiment, the memory device 1100 may include, for example, a Double Data Rate Synchronous Dynamic Random Access Memory (DDR SDRAM), a Low Power Double Data Rate 4 (LPDDR4) SDRAM, a Graphics Double Data Rate (DDDR) SRAM, a Low Power DDR (LPDDR), a Rambus Dynamic Random Access Memory (RDRAM), and a flash memory.

The memory device 1100 may perform a program, read or erase operation under the control of the memory controller 1200.

Figure 2:
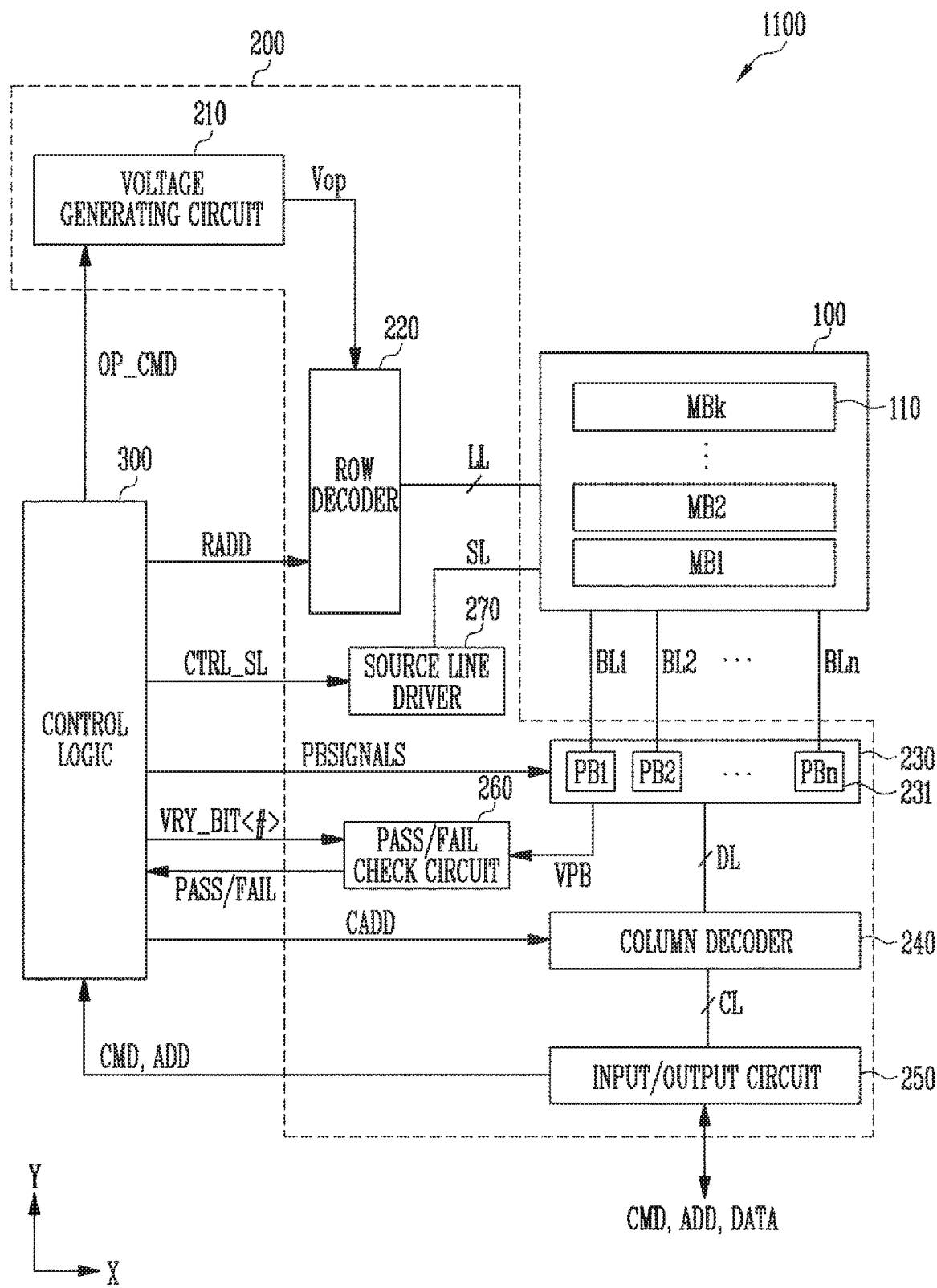
FIG. 2 is a diagram illustrating a memory device according to an embodiment of the present disclosure.

FIG. 2 is a diagram illustrating a memory device according to an embodiment of the present disclosure, for example, the memory device 1100 of FIG. 1.

Referring to FIG. 2, the memory device 1100 may include a memory cell array 100 that stores data. The memory device 1100 may include a peripheral circuit 200 configured to perform a program operation for storing data in the memory cell array 100, a read operation for outputting the stored data, and an erase operation for erasing the stored data. The memory device 1100 may include a control logic 300 that controls the peripheral circuit 200 under the control of the memory controller 1200 of FIG. 1.

The memory cell array 100 may include a plurality of memory blocks MB1 to MBk (where k is a positive integer) 110. Local lines LL and bit lines BL1 to BLn (where n is a positive integer) may be coupled to the memory blocks MB1 to MBk 110. For example, the local lines LL may include a first select line, a second select line, and a plurality of word lines arranged between the first and second select lines. Also, the local lines LL may further include dummy lines arranged between the first select line and the word lines and between the second select line and the word lines. The first select line may be a source select line, and the second select line may be a drain select line. For example, the local lines LL may include word lines, drain and source select lines, and source lines SL. For example, the local lines LL may further include dummy lines. For example, the local lines LL may further include pipe lines. The local lines LL may be coupled to the memory blocks MB1 to MBk 110, respectively, and the bit lines BL1 to BLn may be commonly coupled to the memory blocks MB1 to MBk 110. The memory blocks MB1 to MBk 110 may be implemented in a two-dimensional or three-dimensional structure. For example, memory cells may be arranged in a direction parallel to a substrate in memory blocks 110 having a two-dimensional structure. For example, memory cells may be arranged in a direction vertical to a substrate in memory blocks 110 having a three-dimensional structure.

The peripheral circuit 200 may be configured to perform program, read, and erase operations of a selected memory block 110 under the control of the control logic 300. For example, the peripheral circuit 200, under the control of the control logic 300, may supply verify and pass voltages to the first select line, the second select line, and the word lines, selectively discharge the first select line, the second select line, and the word lines, and verify memory cells coupled a selected word line among the word lines. For example, the peripheral circuit 200 may include a voltage generating circuit 210, a row decoder 220, a page buffer group 230, a column decoder 240, an input/output circuit 250, a pass/fail check circuit 260, and a source line driver 270.

The voltage generating circuit 210 may generate various operating voltages Vop used for program, read, and erase operations in response to an operation signal OP_CMD. Also, the voltage generating circuit 210 may selectively discharge the local lines LL in response to the operation signal OP_CMD. For example, the voltage generating circuit 210 may generate a program voltage, a verify voltage, pass voltages, a read voltage, a source line voltage, and the like under the control of the control logic 300.

The row decoder 220 may transfer the operating voltages Vop to local lines LL coupled to a selected memory block 110 in response to a row address RADD.

The page buffer group 230 may include a plurality of page buffers PB1 to PBn 231 coupled to the bit lines BL1 to BLn. The page buffers PB1 to PBn 231 may operate in response to page buffer control signals PBSIGNALS. For example, the page buffers PB1 to PBn 231 may temporarily store data received through the bit lines BL1 to BLn, or sense voltages or current of the bit lines BL1 to BLn in a read or verify operation. Also, the page buffers PB1 to PBn 231 may sense at least three program states, using a difference in cell current according to a program state of memory cells while one read voltage or program verify voltage is being applied to a selected local line among the local lines LL in the read operation and the program verify operation.

The column decoder 240 may transfer data between the input/output circuit 250 and the page buffer group 230 in response to a column address CADD. For example, the column decoder 240 may exchange data with the page buffers 231 through data lines DL, or exchange data with the input/output circuit 250 through column lines CL.

The input/output circuit 250 may transfer a command CMD and an address ADD, which are received from the memory controller 1200 of FIG. 1, to the control logic 300, or exchange data DATA with the column decoder 240.

In a read operation and a verify operation, the pass/fail check circuit 260 may generate a reference current in response to a permission bit VRY_BIT<#>, and output a pass signal PASS or a fail signal FAIL by comparing a sensing voltage VPB received from the page buffer group 230 with a reference voltage generated by the reference current.

The source line driver 270 may be coupled to a memory cell included in the memory cell array 100 through a source line SL, and control the voltage of a source node of the memory cell. As an example, in a read or verify operation, the source line driver 270 may electrically couple a source node of the memory cell to a ground node. Also, in a program operation, the source line driver 270 may apply a ground voltage to the source node of the memory cell. In an erase operation, the source line driver 270 may apply an erase voltage to the source node of the memory cell. The source line driver 270 may receive a source line control signal CTRL_SL from the control logic 300, and control the voltage of the source node, based on the source line control signal CTRL_SL.

The control logic 300 may control the peripheral circuit 200 by outputting the operation signal OP_CMD, the row address RADD, the page buffer control signals PBSIGNALS, and the permission bit VRY_BIT<#> in response to the command CMD and the address ADD. Also, the control logic 300 may determine whether the verify operation has passed or failed in response to the pass or fail signal PASS or FAIL.

Figure 3:
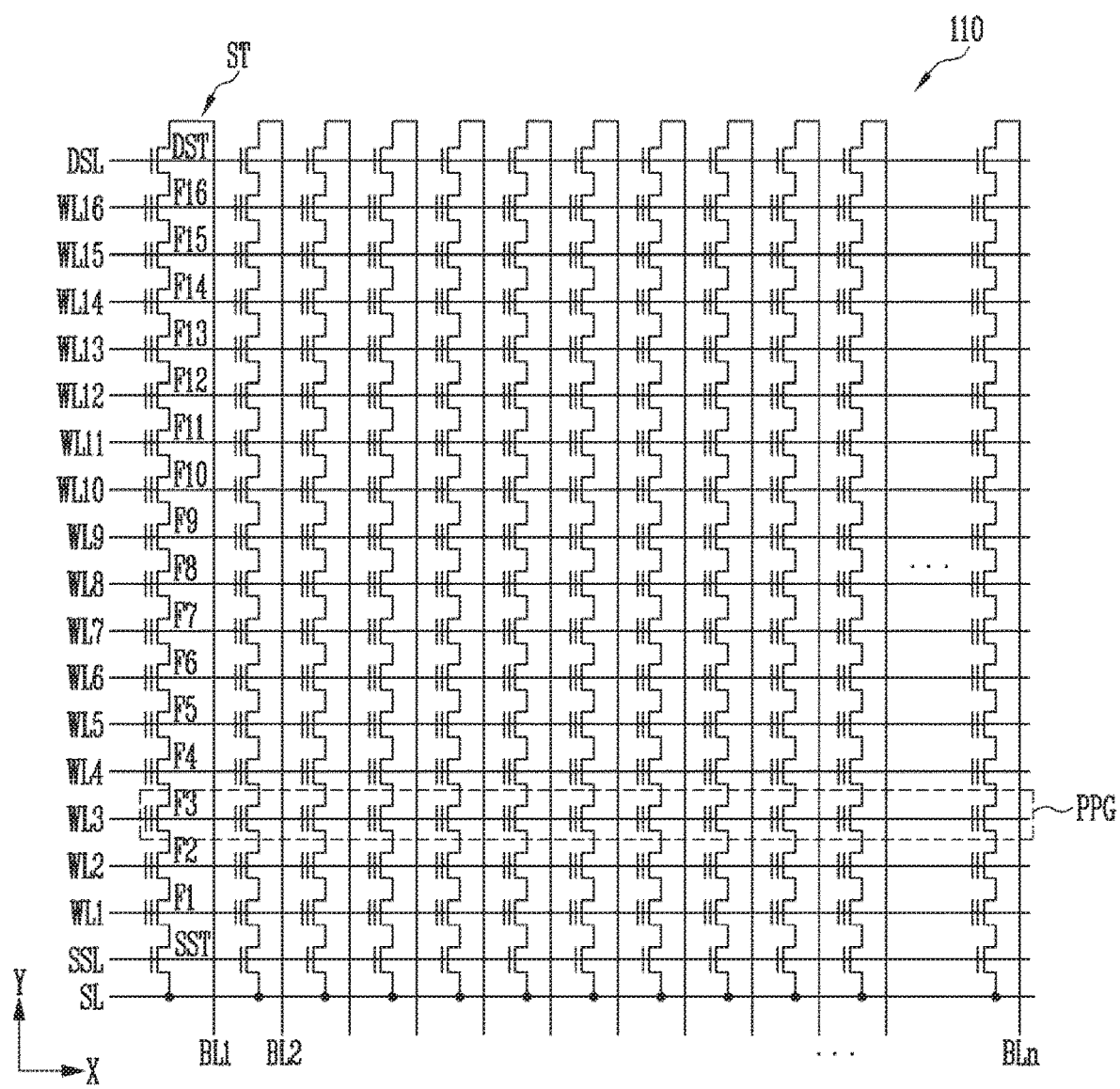
FIG. 3 is a diagram illustrating a memory block according to an embodiment of the present disclosure.

FIG. 3 is a diagram illustrating a memory block according to an embodiment of the present disclosure, for example, the memory block 110 of FIG. 2.

Referring to FIG. 3, in the memory block 110, a plurality of word lines arranged in parallel to one another may be coupled between a first select line and a second select line. The first select line may be a source select line SSL, and the second select line may be a drain select line DSL. More specifically, the memory block 110 may include a plurality of strings ST coupled between bit lines BL1 to BLn and a source line SL. The bit lines BL1 to BLn may be coupled to the strings ST, respectively, and the source line SL may be commonly coupled to the strings ST. The strings ST may be configured identically to one another, and therefore, a string ST coupled to a first bit line BL1 will be described in detail as an example.

The string ST may include a source select transistor SST, a plurality of memory cells F1 to F16, and a drain select transistor DST, which are coupled in series to each other between the source line SL and the first bit line BL1. At least one source select transistor SST and at least one drain select transistor DST may be included in one string ST, and the number of memory cells included in one string ST may be greater than that of the memory cells F1 to F16 shown in FIG. 3.

A source of the source select transistor SST may be coupled to the source line SL, and a drain of the drain select transistor DST may be coupled to the first bit line BL1. The memory cells F1 to F16 may be coupled in series between the source select transistor SST and the drain select transistor DST. Gates of source select transistors SST included in different strings ST may be coupled to the source select line SSL, gates of drain select transistors DST included in different strings ST may be coupled to the drain select line DSL, gates of the memory cells F1 to F16 included in different strings ST may be coupled to a plurality of word lines WL1 to WL16. A group of memory cells coupled to the same word line among the memory cells included in different strings ST may be a physical page PPG. Therefore, physical pages PPG of which number corresponds to that of the word lines WL1 to WL16 may be included in the memory block 110.

One memory cell may store data of one bit. This is generally called as a single level cell (SLC). One physical page PPG may store one logical page (LPG) data. The one LPG data may include data bits of which number corresponds to that of cells included in one physical page PPG. In addition, one memory cell may store data of two or more bits. This is generally called as a multi-level cell. One physical page PPG may store two or more LPG data.

Figure 4:
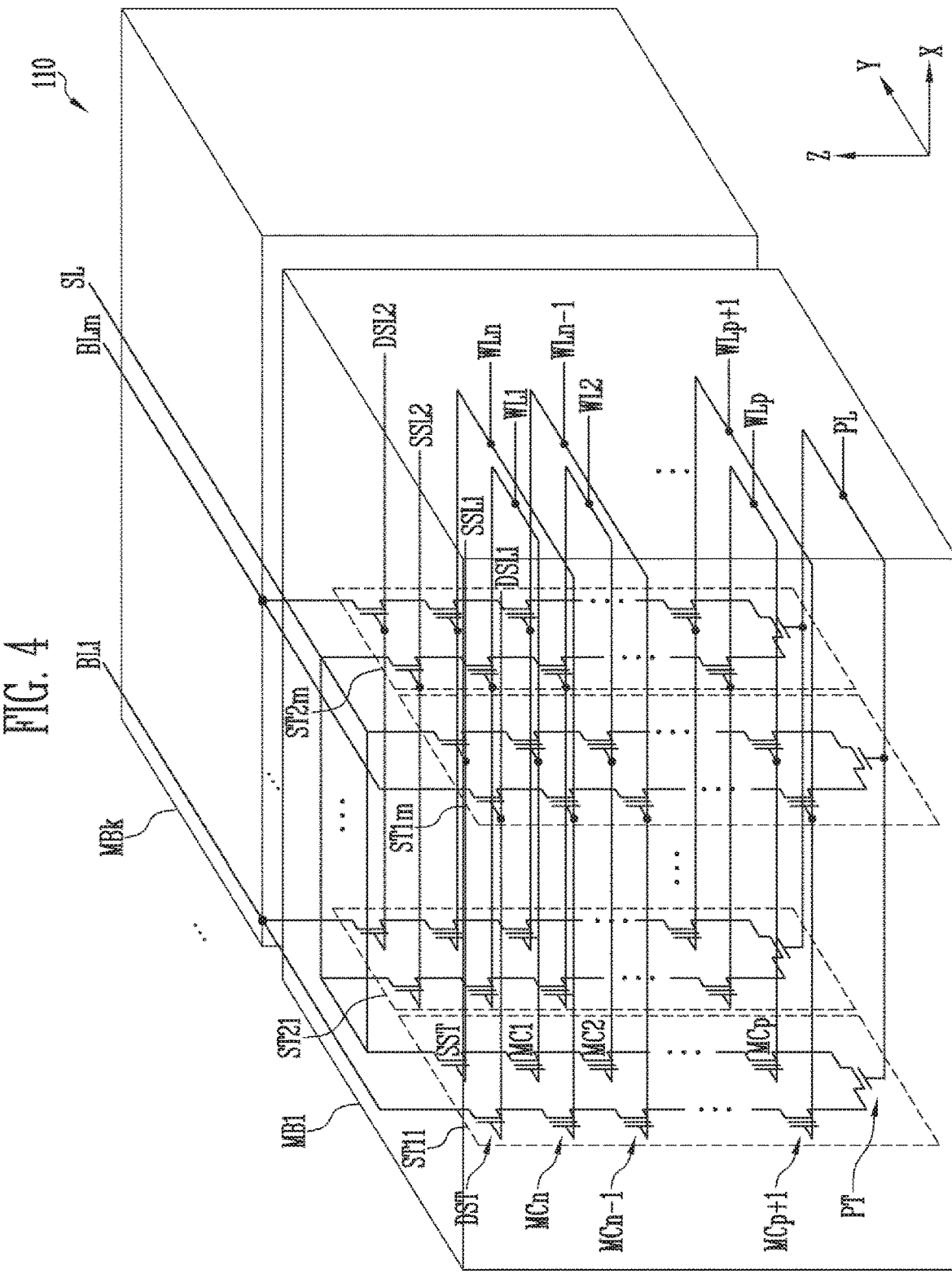
FIG. 4 is a diagram illustrating an embodiment of a three-dimensionally configured memory block.

FIG. 4 is a diagram illustrating an embodiment of a three-dimensionally configured memory block.

Referring to FIG. 4, the memory cell array 100 of FIG. 2 may include a plurality of memory blocks MB1 to MBk 110. The memory block 110 may include a plurality of strings ST11 to ST1m and ST21 to ST2m. In an embodiment, each of the plurality of strings ST11 to ST1*m* and ST21 to ST2*m* may be formed in a 'U' shape. In the memory block 110, m strings may be arranged in a row direction (i.e., X direction). Although FIG. 4 illustrates that two strings are arranged in a column direction (i.e., Y direction), this is for convenience, and the present disclosure is not limited thereto. That is, three or more strings may be arranged in the column direction (i.e., Y direction).

Each of the plurality of strings ST11 to ST1*m* and ST21 to ST2*m* may include at least one source select transistor SST, first to nth memory cells MC1 to MCn, a pipe transistor PT, and at least one drain select transistor DST.

The source and drain select transistors SST and DST and the memory cells MC1 to MCn may have structures similar to one another. For example, each of the source and drain select transistors SST and DST and the memory cells MC1 to MCn may include a channel layer, a tunnel insulating layer, a charge trapping layer, and a blocking insulating layer. For example, a pillar for providing the channel layer may be provided in each string. For example, a pillar for providing at least one of the channel layer, the tunnel insulating layer, the charge trapping layer, and the blocking insulating layer may be provided in each string.

The source select transistor SST of each string may be coupled between a source line SL and memory cells MC1 to MCp.

In an embodiment, source select transistors of strings arranged in the same row may be coupled to a source select line extending in the row direction, and source select transistors of strings arranged in different rows may be coupled to different source select lines. In FIG. 4, source select transistors of strings ST11 to ST1*m* of a first row may be coupled to a first source select line SSL1. Source select transistors of strings ST21 to ST2*m* of a second row may be coupled to a second source select line SSL2.

In another embodiment, the source select transistors of the strings ST11 to ST1*m* and ST21 to ST2*m* may be commonly coupled to one source select line.

First to nth memory cells MC1 to MCn of each string may be coupled between the source select transistor SST and the drain select transistor DST.

The first to nth memory cells MC1 to MCn may be divided into first to pth memory cells MC1 to MCp and (p+1)th to nth memory cells MCp+1 to MCn. The first to pth memory cells MC1 to MCp may be sequentially arranged in a vertical direction (i.e., Z direction), and be coupled in series to each other between the source select transistor SST and the pipe transistor PT. The (p+1)th to nth memory cells MCp+1 to MCn may be sequentially arranged in the vertical direction (i.e., Z direction), and be coupled in series to each other between the pipe transistor PT and the drain select transistor DST. The first to pth memory cells MC1 to MCp and the (p+1)th to nth memory cells MCp+1 to MCn may be coupled to each other through the pipe transistor PT. Gates of the first to nth memory cells MC1 to MCn of each string may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. A gate of the pipe transistor PT of each string may be coupled to a pipe line PL.

The drain select transistor DST of each string may be coupled to a bit line and the memory cells MCp+1 to MCn. Strings arranged in the row direction may be coupled to a drain select line extending in the row direction. Drain select transistors of the strings ST11 to ST1, of the first row may be coupled to a first drain select line DSL1. Drain select transistors of the strings ST21 to ST2*m* of the second row may be coupled to a second drain select line DSL2.

Strings arranged in the column direction may be coupled to bit lines extending in the column direction. In FIG. 4, strings ST11 and ST21 of a first column may be coupled to a first bit line BL1. Strings ST1*m* and ST2*m* of an mth column may be coupled to an nth bit line BLn.

Memory cells coupled to the same word line among the strings arranged in the row direction may constitute one page. For example, memory cells coupled to the first word line WL1 among the strings ST11 to ST1*m* of the first row may constitute one page. Memory cells coupled to the first word line WL1 among the strings ST21 to ST2*m* of the second row may constitute another page. When any one of the drain select lines DSL1 and DSL2 is selected, strings arranged in one row direction may be selected. When any one of the word lines WL1 to WLn is selected, one page among the selected strings may be selected.

Figure 5:
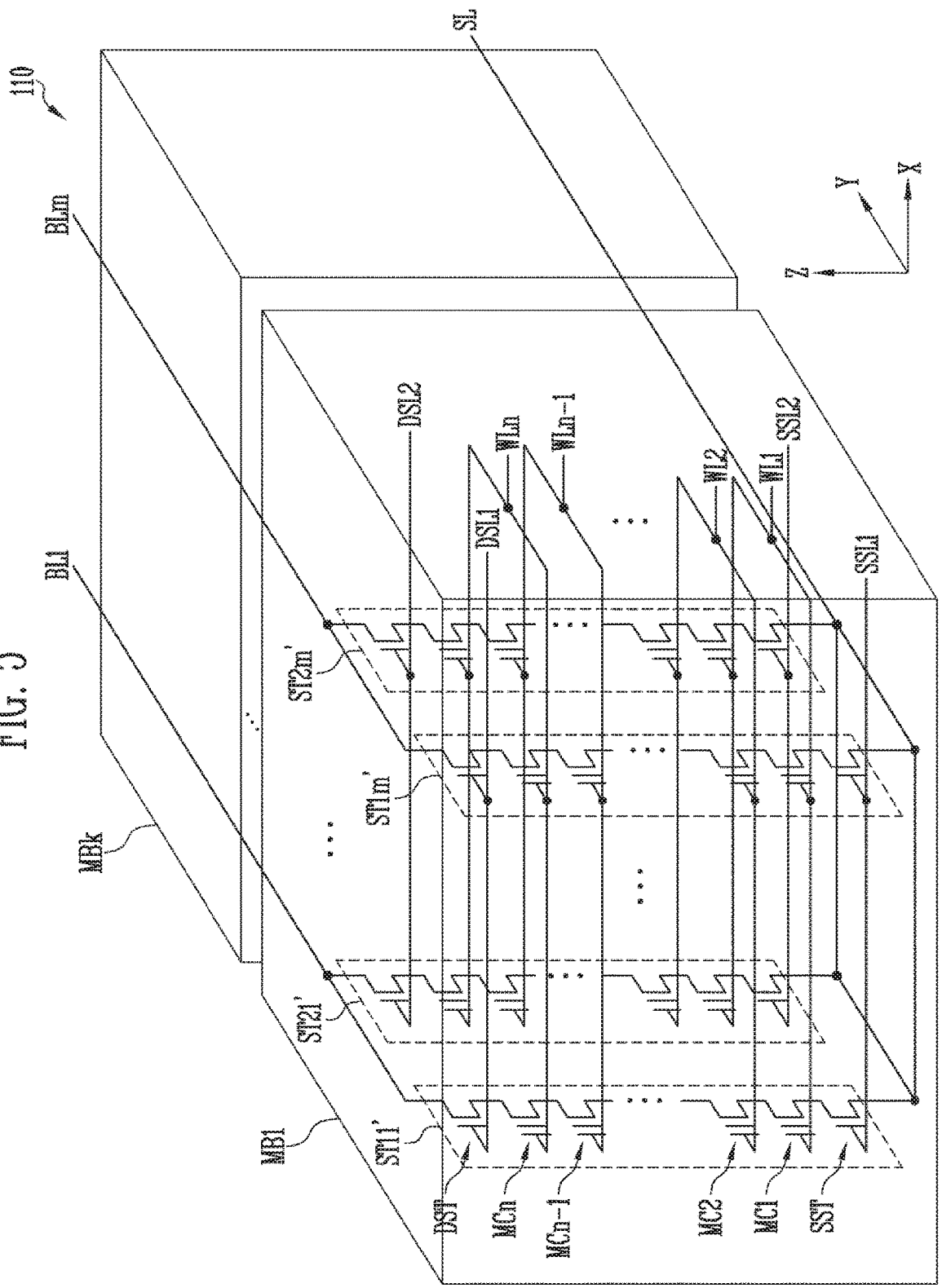
FIG. 5 is a diagram illustrating another embodiment of the three-dimensionally configured memory block.

FIG. 5 is a diagram illustrating another embodiment of the three-dimensionally configured memory block.

Referring to FIG. 5, the memory cell array 100 of FIG. 2 may include a plurality of memory blocks MB1 to MBk 110. The memory block 110 may include a plurality of strings ST11' to ST1*m*' and ST21' to ST2*m*'. Each of the plurality of strings ST11' to ST1*m*' and ST21' to ST2*m*' may extend along a vertical direction (i.e., Z direction). In the memory block 110, m strings may be arranged in a row direction (i.e., X direction). Although FIG. 5 illustrates that two strings are arranged in a column direction (i.e., Y direction), this is for convenience, and three or more strings may be arranged in the column direction (i.e., Y direction).

Each of the plurality of strings ST11' to ST1*m*' and ST21' to ST2*m*' may include at least one source select transistor SST, first to nth memory cells MC1 to MCn, and at least one drain select transistor DST.

The source select transistor SST of each string may be coupled between a source line SL and the memory cells MC1 to MCn. Source select transistors of strings arranged in the same row may be coupled to the same source select line. Source select transistors of strings ST11' to ST1*m*' arranged on a first row may be coupled to a first source select line SSL1. Source select transistors of strings ST21' to ST2*m*' arranged on a second row may be coupled to a second source select line SSL2. In another embodiment, the source select transistors of the strings ST11' to ST1*m*' and ST21' to ST2*m*' may be commonly coupled to one source select line.

The first to nth memory cells MC1 to MCn of each string may be coupled in series to each other between the source select transistor SST and the drain select transistor DST. Gates of the first to nth memory cells MC1 to MCn may be coupled to first to nth word lines WL1 to WLn, respectively.

In an embodiment, at least one of the first to nth memory cells MC1 to MCn may be used as a dummy memory cell. When a dummy memory cell is provided, the voltage or current of a corresponding string can be stably controlled. Accordingly, the reliability of data stored in the memory block 110 can be improved.

The drain select transistor DST of each string may be coupled between a bit line and the memory cells MC1 to MCn. Drain select transistors DST of strings arranged in the row direction may be coupled to a drain select line extending in the row direction. The drain select transistors DST of the strings ST11' to ST1*m*' of the first row may be coupled to a first drain select line DSL1. The drain select transistors DST of the strings ST21' to ST2m' of the second row may be coupled to a second drain select line DSL2.

Therefore, the memory block 110 of FIG. 5 may have a circuit substantially similar to that of the memory block 110 of FIG. 4. Specifically, the memory block 110 of FIG. 5 does not include the pipe transistor PT that is shown in FIG. 4.

Figure 6:
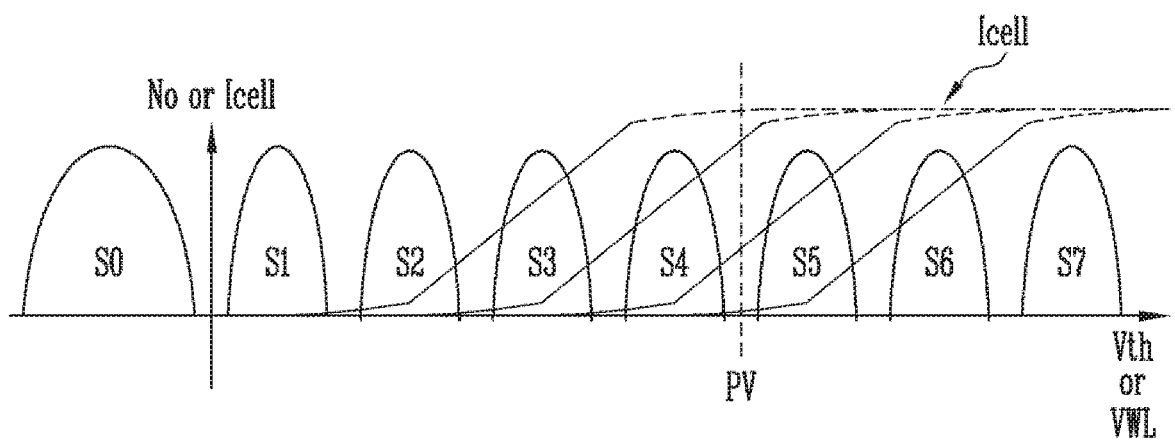
FIG. 6 is a diagram illustrating threshold voltage distributions of memory cells and cell currents of the memory cells according to word line voltages.

FIG. 6 is a diagram illustrating threshold voltage distributions Vth of memory cells and cell currents of the memory cells according to word line voltages VWL.

In the embodiment of the present disclosure, for convenience, the memory cells are triple level cells (TLCs) having eight program states S0 to S7 according to the threshold voltage distributions.

The memory cells may be programmed to the program states S0 to S7 in a program operation, and be divided into on and off cells according to a read voltage PV applied to a word line in a read operation such that the program states of the memory cells are sensed. However, memory cells having threshold voltage distributions lower than the read voltage PV, i.e., memory cells having program states S0 to S4 are all sensed as on cells, but have different cell currents Icell according to the program states S0 to S4 of the memory cells. That is, when the read voltage PV is applied to the word line of the memory cells, the memory cells having the program states S0 to S4 lower than the read voltage PV have different cell currents Icell, and accordingly, bit lines coupled to the memory cells have different bit line voltages according to the program states S0 to S4.

Figure 7:
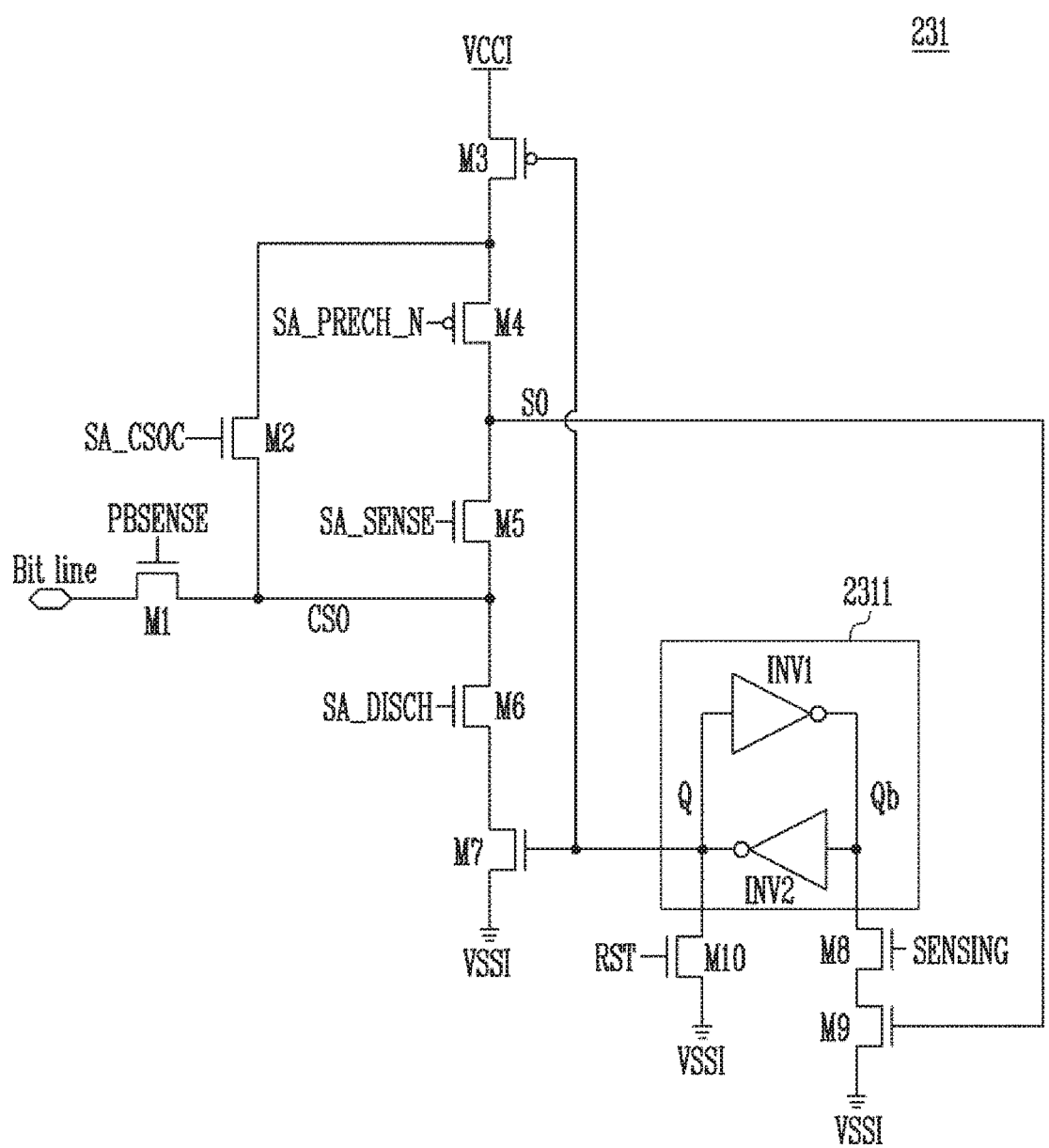
FIG. 7 is a diagram illustrating a page buffer according to an embodiment of the present disclosure.

FIG. 7 is a diagram illustrating a page buffer 231 according to an embodiment of the present disclosure.

Referring to FIG. 7, the page buffer 231 is coupled to memory cells MC through a bit line Bit line, and may perform a bit line precharge operation of charging charges supplied from a power voltage VCCI through first to fifth transistors M1 to M5 to the bit line Bit line. The first transistor M1 is controlled by a first sense signal PBSENSE. The second transistor M2 is controlled by a first precharge signal SA_CSOC. The third transistor M3 is controlled by a storage 2311. The fourth transistor M4 is controlled by a second precharge signal SA_PRECH_N. The fifth transistor M5 is controlled by a second sense signal SA_SENSE. The storage 2311 may be configured as a latch or fuse.

Also, the page buffer 231 may discharge, to a ground voltage VSSI, charges charged to the bit line Bit line through the first transistor M1, a sixth transistor M6, and a seventh transistor M7. The sixth transistor M6 is controlled by a first discharge signal SA_DISCH, and the seventh transistor M7 is controlled by the storage 2311.

The page buffer 231 may include the storage 2311 including a first inverter INV1 and a second inverter INV2. The storage 2311 may control the bit line precharge operation by turning on or turning off the third transistor M3 through a first node Q. A second node Qb and the first node Q have values reversed from each other. The voltage of a sense node S0 during a sensing operation on the memory cell MC is determined based on a threshold voltage of the memory cell MC. For example, the voltage of the bit line Bit line may be determined based on the threshold voltage of the memory cell MC. When the first and fifth transistors M1 and M5 are turned on, the bit line Bit line and the sense node S0 are coupled to each other through a common node CS0, and hence the voltage of the sense node S0 may be determined based on the threshold voltage of the memory cell MC. The storage 2311 may store a result obtained by sensing the threshold voltage of the memory cell MC through an eighth transistor M8 and a ninth transistor M9, which are coupled between the second node Qb and the ground voltage VSSI.

The eighth transistor M8 may be turned on according to a sensing signal SENSING applied at a high level in the sensing operation. The second node Qb may maintain the high level that is an initial state or be changed to a low level according to the ninth transistor M9 turned on or turned off based on a potential level of the sense node S0, to latch data corresponding to the potential level of the sense node S0. When the threshold voltage of the memory cell MC is low, the potential level of the sense node S0 during the sensing operation may be the low level, and the ninth transistor M9 may be turned off. When the threshold voltage of the memory cell MC is high, the potential level of the sense node S0 during the sensing operation may be the high level, and the ninth transistor M9 may be turned on. A tenth transistor M10 is controlled by a reset signal RST, to initialize the first node Q to the potential level of the ground voltage VSSI.

The page buffer 231 may divide an evaluation operation in a read operation into a pre-evaluation operation and a post-evaluation operation by adjusting the potential level of the second sense signal SA_SENSE, and perform the pre-evaluation operation and the post-evaluation operation. In the evaluation operation, the potential level of the sense node S0 is adjusted according to the potential level of the bit line Bit line.

In the pre-evaluation operation, the page buffer 231 may divide the memory cells coupled to the bit line Bit line into on and off cells according to cell current values changed depending on the read voltage applied to the word line. In the post-evaluation operation, the page buffer 231 may determine whether memory cells determined as the off cells in the pre-evaluation operation are off cells having threshold voltages higher than the read voltage or on cells having threshold voltages that are lower than the read voltage but are adjacent to the read voltage. The memory cell determined as an on cell in the post-evaluation operation is a memory cell programmed to a program state having threshold voltages higher than that of the memory cell determined as an on cell in the pre-evaluation operation.

In the above-described embodiment, the evaluation operation is divided into the pre-evaluation operation and the post-evaluation operation. However, when four or more program states are distinguished using one read voltage, the page buffer 231 may be designed and modified to perform at least three evaluation operations.

Although the read operation of the memory device is described in the above-described embodiment, the present disclosure is not limited thereto, and may be applied to a program verify operation during a program operation of the memory device. Therefore, a program verify operation on a plurality of program states may be performed using one program verify voltage, or a verify operation on threshold voltages of memory cells and at least two target levels (e.g., a main verify level and a pre verify level lower than the main verify level) may be performed using one program verify voltage.

Figure 8:
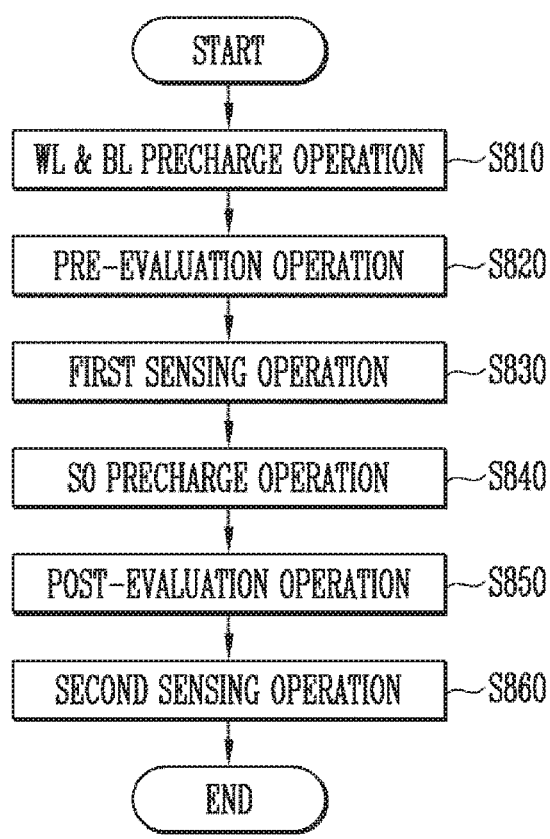
FIG. 8 is a flowchart describing a read operation of a memory device according to an embodiment of the present disclosure.

FIG. 8 is a flowchart describing a read operation of a memory device according to an embodiment of the present disclosure.

The read operation of the memory device according to the embodiment of the present disclosure will be described as follows with references to FIGS. 2, 5, 6, 7, and 8.

In the embodiment of the present disclosure, a method for distinguishing and sensing, in a state in which one read voltage PV is applied, a program state S5 having threshold voltages higher than the read voltage PV, a program state S4 having threshold voltages that are lower than the read voltage PV but are adjacent to the read voltage PV, and a program state S3 having threshold voltages lower than those of the program state S4 will be described, as an example.

1) Word Line & Bit Line Precharge Operation (S810)

In the read operation, the voltage generating circuit 210 generates a read voltage PV and a pass voltage which are used for the read operation in response to the operation signal OP_CMD. The row decoder 220 transfers the read voltage PV and the pass voltage to local lines LL coupled to a selected memory block 110 in response to the row address RADD. For example, the row decoder 220 applies the read voltage PV to a selected word line among the local lines LL, and applies the pass voltage to unselected word lines, thereby precharging potential levels of the word lines.

The plurality of page buffers PB1 to PBn 231 included in the page buffer group 230 precharge corresponding bit lines BL1 to BLn. In a bit line precharge operation, each of the plurality of page buffers PB1 to PBn 231 may charge charges supplied from the power voltage VCCI through the first to fifth transistors M1 to M5 to a corresponding bit line Bit line among the bit lines BL1 to BLn. For example, the first transistor M1 is turned on by the first sense signal PBSENSE, the second transistor M2 is turned on by the first precharge signal SA_CSOC, the third transistor M3 is turned on according to the potent a level of the first node Q, which is initialized to the low level, the fourth transistor M4 is turned on by the second precharge signal SA_PRECH_N, and the fifth transistor M5 is turned on by the second sense signal SA_SENSE, so that the bit line Bit line is precharged. The first sense signal PBSENSE and the second sense signal SA_SENSE may have the same first potential level, and the first precharge signal SA_CSOC may have a second potential level that is lower than the first potential level by a certain potential level.

2) Pre-Evaluation Operation (S820)

After the step S810, a pre-evaluation operation is performed in the state in which the read voltage PV is applied to the selected word line. In the pre-evaluation operation, the potential level of the sense node S0 is adjusted according to the potential level of the bit line Bit line. In the pre-evaluation operation, the potential level of the sense node S0 is changed depending on whether memory cells coupled to the selected word line are off cells or on cells. Off cells represent cells in the program state S5 having threshold voltages higher than the read voltage PV. On cells represent cells in the program state S4 having threshold voltages that are lower than the read voltage PV but are adjacent to the read voltage PV or the program state S3 having threshold voltages lower than the read voltage PV.

In the bit line precharge operation, each of the plurality of page buffers PB1 to PBn 231 may change the potential level of the sense node S0 depending on the potential level of the corresponding bit line Bit line among the bit lines BL1 to BLn through the first and fifth transistors M1 and M5.

When the memory cell coupled to the selected word line is an off cell that is in the program state S5 having threshold voltages higher than the read voltage PV, the fourth transistor M4 is turned off by the second precharge signal SA_PRECH_N having the high level, and the first transistor M1 is turned on by the first sense signal PBSENSE having the first potential level. Thus, the potential level of the common node CS0 is lowered to a level almost equal to that of the bit line Bit line. The third transistor M3 is in a state in which it is turned on according to the potential level of the first node Q, and the second transistor M2 is in a state in which it is turned on by the first precharge signal SA_CSOC having the second potential level. Hence, the potential level of the common node CS0 is not considerably lowered, and the common node CS0 maintains a potential level equal to that of the bit line Bit line. Since the threshold voltage of the memory cell is higher than the read voltage PV, the potential level of the bit line Bit line is maintained as a precharge level. The second sense signal SA_SENSE is applied with a third potential level that is lower than the first sense signal PBSENSE by a first set value. The third potential level is a potential level that is higher than a ground voltage level and is lower than the first potential level. The fifth transistor M5 is turned off by the second sense signal SA_SENSE having the third potential level, and the sense node S0 maintains a precharge level (e.g., a VCCI level).

When the memory cell coupled to the selected word line is an on cell that is in the program state S4 having threshold voltages that are lower than the read voltage PV but are adjacent to the read voltage PV, the fourth transistor M4 is turned off by the second precharge signal SA_PRECH_N having the high level, and the first transistor M1 is turned on by the first sense signal PBSENSE having the first potential level. Thus, the potential level of the common node CS0 is lowered to a level almost equal to that of the bit line Bit line. The third transistor M3 is in a state in which it is turned on according to the potential level of the first node Q, and the second transistor M2 is in a state in which it is turned on by the first precharge signal SA_CSOC having the second potential level. Hence, the potential level of the common node CS0 is not considerably lowered, and the common node CS0 maintains a potential level equal to that of the bit line Bit line. Since the threshold voltage of the memory cell is lower than the read voltage PV but is adjacent to the read voltage PV, the voltage of the bit line Bit line is lowered to a certain level. When the second sense signal SA_SENSE is applied with the third potential level that is lower than the first sense signal PBSENSE by the first set value, the difference between the third potential level of the second sense signal SA_SENSE and the potential level of the bit line Bit line is equal to or lower than the threshold voltage of the fifth transistor M5, so that the fifth transistor M5 is turned off. Thus, the sense node S0 maintains the precharge level (e.g., the VCCI level).

When the memory cell coupled to the selected word line is an on cell that is in the program state S3 having threshold voltages lower than the read voltage PV, the fourth transistor M4 is turned off by the second precharge signal SA_PRECH_N having the high level, and the first transistor M1 is turned on by the first sense signal PBSENSE having the first potential level. Thus, the potential level of the common node CS0 is lowered to a level almost equal to that of the bit line Bit line. Since the threshold voltage of the memory cell is lower than the read voltage PV, the memory cells is in the turn-on state. Thus, the voltage of the bit line Bit line is lowered to the ground voltage level. When the second sense signal SA_SENSE is applied with the third potential level that is lower than the first sense signal PBSENSE by the first set value, the fifth transistor M5 is turned on by the second sense signal SA_SENSE having the third potential level. Thus, the potential level of the sense node S0 is lowered by the voltage of the bit line Bit line having the ground voltage level.

3) First Sensing Operation (S830)

After the step S820, a sensing operation is performed by latching data to the storage 2311 according to the potential level of the sense node S0.

For example, when the threshold voltage of the memory cell in the program state S4 and the program state S5, the potential level of the sense node S0 maintains the precharge level that is the power voltage VCCI level. Therefore, the ninth transistor M9 is in the turn-on state. Subsequently, the eighth transistor M8 is turned on according to the sensing signal SENSING applied with the high level in the sensing operation, and accordingly, the potential level of the second node Qb is changed from the high level that is an initial state to the low level. In addition, the potential level of the first node Q is changed from the low level that is an initial state to the high level.

When the threshold voltage of the memory cell is in the program state S3, the potential level of the sense node S0 is lowered to the low level according to the potential level of the discharged bit line Bit line. Therefore, the ninth transistor M9 is in the turn-off state. Accordingly, although the eighth transistor M8 is turned on according to the sensing signal SENSING applied with the high level in the sensing operation, the second node Qb maintains the high level that is the initial state, and the first node Q maintains the low level that is the initial state.

Data latched in step S830 may be output through the column decoder 240 and the input/output circuit 250. Therefore, data corresponding to the program states S3 to S5 may be read by combining data determined as the program state S3 among the data output in the step S830 and data determined as the program state S4 and the program state S5 in the step S830.

The data latched in the step S830 may be output through the column decoder 240 and the input/output circuit 250. In particular, the data determined as the program state S3 may be determined as actual data to be output.

4) Sense Node Precharge Operation (S840)

After the step S830, the sense node S0 is precharged to the high level.

The reset signal RST having the high level is applied to the tenth transistor M10, so that the first node Q is initialized to the low level. Therefore, the third transistor M3 is turned on. Subsequently, the second precharge signal SA_PRECH_N is applied with the low level, so that the fourth transistor M4 is turned on. Thus, the sense node S0 is precharged to the power voltage VCCI level.

5) Post-Evaluation Operation (S850)

After the step S840, a post-evaluation operation is performed in the state in which the read voltage PV is applied to the selected word line. In the post-evaluation operation, the potential level of the sense node S0 is adjusted according to the potential level of the bit line Bit line. In the post-evaluation operation, the potential level of the sense node S0 is changed depending on whether the memory cells coupled to the selected word line are off cells or on cells. Off cells represent cells in the program state S5 having threshold voltages higher than the read voltage PV. On cells represent cells in the program state S4 having threshold voltages that are lower than the read voltage PV but are adjacent to the read voltage PV.

When the memory cell coupled to the selected word line is an off cell that is in the program state S5 having threshold voltages higher than the read voltage PV, the fourth transistor M4 is turned off by the second precharge signal SA_PRECH_N having the high level, and the first transistor M1 is turned on by the first sense signal PBSENSE having the first potential level. Thus, the potential level of the common node CS0 is lowered to a level almost equal to that of the bit line Bit line. The third transistor M3 is in a state in which it is turned on according to the potential level of the first node Q, and the second transistor M2 is in a state in which it is turned on by the first precharge signal SA_CSOC having the second potential level. Hence, the potential level of the common node CS0 is not considerably lowered, and the common node CS0 maintains a potential level equal to that of the bit line Bit line. Since the threshold voltage of the memory cell is higher than the read voltage PV, the potential level of the bit line Bit line is maintained as the precharge level. The second sense signal SA_SENSE is applied with a fourth potential level that is higher than the third potential level by a second set value. The second set value is preferably smaller than the first set value. Therefore, the fourth potential level is lower than the first potential level. The fifth transistor M5 is turned off by the second sense signal SA_SENSE having the fourth potential level, and the sense node S0 maintains the precharge level (e.g., the VCCI level).

When the memory cell coupled to the selected word line is an on cell that is in the program state S4 having threshold voltages that are lower than the read voltage PV but are adjacent to the read voltage PV, the fourth transistor M4 is turned off by the second precharge signal SA_PRECH_N having the high level, and the first transistor M1 is turned on by the first sense signal PBSENSE having the first potential level. Thus, the potential level of the common node CS0 is lowered to a level almost equal to that of the bit line Bit line. The second sense signal SA_SENSE is applied with the fourth potential level that is higher than the third potential level by the second set value. The fifth transistor M5 is turned on by the second sense signal SA_SENSE having the fourth potential level, and the potential level of the sense node S0 is lowered by the potential level of the bit line Bit line.

6) Second Sensing Operation (S860)

After the step S850, a sensing operation is performed thereby latching data to the storage 2311 according to the potential level of the sense node S0.

For example, when the threshold voltage of the memory cell in the program state S5, the potential level of the sense node S0 maintains the precharge level that is the power voltage VCCI level. Therefore, the ninth transistor M9 is in the turn-on state. Subsequently, the eighth transistor M8 is turned on according to the sensing signal SENSING applied with the high level in the sensing operation. Accordingly, the potential level of the second node Qb is changed from the high level that is an initial state to the low level. In addition, the potential level of the first node Q is changed from the low level that is an initial state to the high level.

When the threshold voltage of the memory cell is in the program state S4, the potential level of the sense node S0 is lowered to the low level according to the potential level of the bit line Bit line discharged to the ground voltage level. Therefore, the ninth transistor M9 is in the turn-off state. Accordingly, although the eighth transistor M8 is turned on according to the sensing signal SENSING applied with the high level in the sensing operation, the second node Qb maintains the high level that is the initial state, and the first node Q maintains the low level that is the initial state.

The data latched in the step S860 may be output through the column decoder 240 and the input/output circuit 250. Therefore, data corresponding to the program states S3 to S5 may be read by combining data determined as the program state S3 among the data output in the step S830 and data determined as the program state S4 and the program state S5 in the step S860.

As described above, according to the embodiment of the present disclosure, at least three program states can be sensed using one read voltage, and thus the number of sensing operations using another read voltage in the read operation is decreased. Accordingly, the precharge time of the word and bit lines, which is required to prepare a sensing operation using a new read voltage in the read operation, is skipped, so that the total time required to perform the read operation can be decreased.

Figure 9:
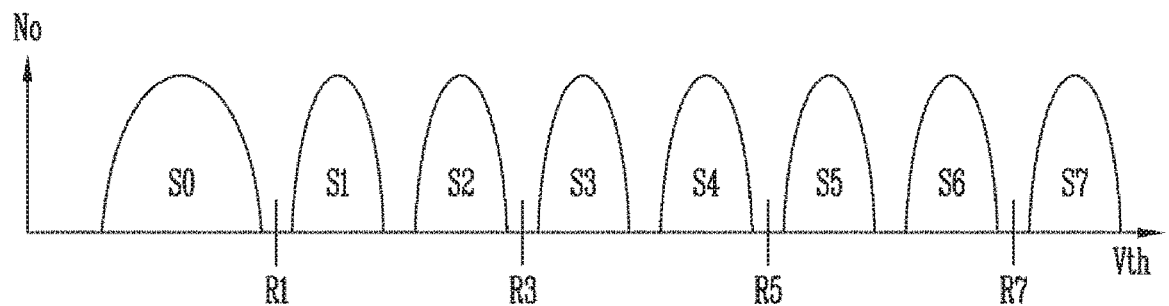
FIG. 9 is a threshold voltage distribution diagram illustrating a read operation of a memory device according to an embodiment of the present disclosure.

FIG. 9 is a threshold voltage distribution diagram illustrating a read operation of a memory device according to an embodiment of the present disclosure.

In FIG. 9, a case where three program states are sensed using one read voltage as described with references to FIGS. 2, 5, 7, and 8 will be described as an example.

Referring to FIG. 9, in a read operation of TLCs having eight program states S0 to S7, memory cells that is in the program state S0 are sensed using a first read voltage R1, and sensed data is output. Subsequently, the memory cells that are in the program state S0 are maintained in a read off state in a subsequent read operation by maintaining a bit line to be in a high level state.

Subsequently, memory cells that are in the program state S1 and the program state S2, which have threshold voltages lower than a second read voltage R3, and memory cells that are in the program states S3 to S7 having the threshold voltages higher than the second read voltage R3 are individually sensed using the second read voltage R3, and sensed data are output. Subsequently, the memory cells that are in the program state S0, the program state S1, and the program state S2 are maintained in the read off state in a subsequent read operation by maintaining the bit line to be in the high level state.

Subsequently, memory cells that are in the program state S3 and the program state S4, which have threshold voltages lower than a third read voltage R5, and memory cells that are in the program states S5 to S7 having the threshold voltages higher than the third read voltage R5 are individually sensed using the third read voltage R5, and sensed data are output. Subsequently, the memory cells that are in the program states S0 to S4 are maintained in the read off state in a subsequent read operation by maintaining the bit line to be in the high level state.

Subsequently, memory cells that are in the program state S5 and the program state S6, which have threshold voltages lower than a fourth read voltage R7, and memory cells that are in the program state S7 having threshold voltages higher than the fourth read voltage R7 are individually sensed, and sensed data are output.

Accordingly, in the TLCs having the eight program states S0 to S7, the read operation can be performed by performing sensing operations, using the four read voltages R1, R3, R5, and R7.

Figure 10:
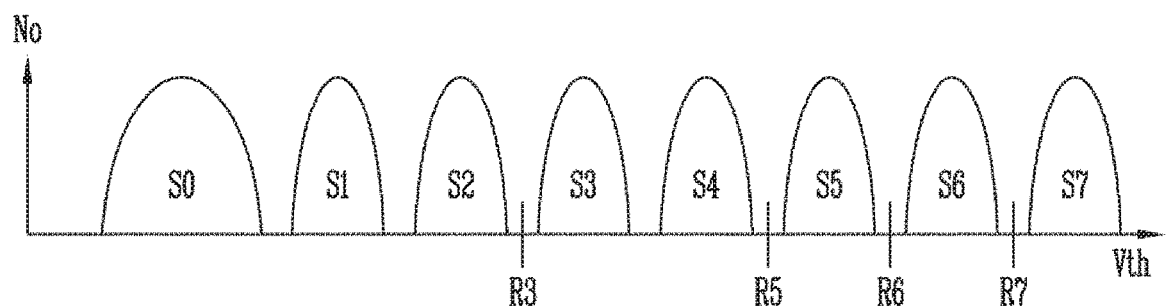
FIG. 10 is a threshold voltage distribution diagram illustrating a read operation of a memory device according to another embodiment of the present disclosure.

FIG. 10 is a threshold voltage distribution diagram illustrating a read operation of a memory device according to an embodiment of the present disclosure.

In FIG. 10, a case where five program states are sensed using one read voltage will be described as an example.

TLCs having eight program states S0 to S7 may correspond to data of three bits, i.e., a least significant bit (LSB), a central significant bit (CSB), and a most significant bit (MSB) for every program state, and a read operation of the TLCs may be configured with an LSB read operation, a CSB read operation, and an MSB read operation.

Referring to FIG. 10, the read voltage in an LSB read operation is fixed to R5, and the voltage of the second sense signal SA_SENSE in a pre-evaluation operation is adjusted to a voltage capable of distinguishing the program state S0 and the program state S1 and is applied. Subsequently, memory cells that are in the program state S0 and the program state S1 are individually sensed by performing a first sensing operation, and sensed data are output. Subsequently, the memory cells sensed in the program state S0 are maintained in the read off state in a subsequent read operation by maintaining the bit line to be in the high level state.

Subsequently, in the state in which the read voltage is fixed to R5, the voltage of the second sense signal SA_SENSE in a post-evaluation operation is adjusted to a voltage capable of distinguishing the program state S4 and the program state S5 and is applied. Subsequently, memory cells that are in the program state S4 and the program state S5 are individually sensed by performing a second sensing operation, and sensed data are output. LSB data of the TLCs may be combined using the data output as the result obtained by performing the first sensing operation and the second sensing operation.

A CSB read operation may be performed after the LSB read operation. The read voltage in the CSB read operation is fixed to R6, and the voltage of the second sense signal SA_SENSE in a first evaluation operation is adjusted to a voltage capable of distinguishing the program state S1 and the program state S2 and is applied. Subsequently, memory cells that are in the program state S1 and the program state S2 are individually sensed by performing a first sensing operation, and sensed data are output. Subsequently, the memory cells sensed in the program states S1 and S2 are maintained in the read off state in a subsequent read operation by maintaining the bit line to be in the high level state. The read voltage in the CSB read operation is fixed to R6, and the voltage of the second sense signal SA_SENSE in a second evaluation operation is adjusted to a voltage capable of distinguishing the program state S3 and the program state S4 and is applied. Subsequently, memory cells that are in the program state S3 and the program state S4 are individually sensed by performing a second sensing operation, and sensed data are output. Subsequently, the memory cells sensed in the program states S3 and S4 are maintained in the read off state in a subsequent read operation by maintaining the bit line to be in the high level state. The read voltage in the CSB read operation is fixed to R6, and the voltage of the second sense signal SA_SENSE in a third evaluation operation is adjusted to a voltage capable of distinguishing the program state S5 and the program state S6 and is applied. Subsequently, memory cells that are in the program state S5 and the program state S6 are individually sensed by performing a third sensing operation, and sensed data are output. CSB data of the TLCs may be combined using the data output as the result obtained by performing the first to third sensing operations.

An MSB read operation may be performed after the CSB read operation. The read voltage in the MSB read operation is fixed to R3, and the voltage of the second sense signal SA_SENSE in a pre-evaluation operation is adjusted to a voltage capable of distinguishing the program state S2 and the program state S3 and is applied. Subsequently, memory cells that are in the program state S2 and the program state S3 are individually sensed by performing a first sensing operation, and sensed data are output. Subsequently, the memory cells sensed in the program state S2 are maintained in the read off state in a subsequent read operation by maintaining the bit line to be in the high level state.

Subsequently, in a state in which the read voltage is fixed to R7, the voltage of the second sense signal SA_SENSE in a post-evaluation operation is adjusted to a voltage capable of distinguishing the program state S6 and the program state S7 and is applied. Subsequently, memory cells that are in the program state S6 and the program state S7 are individually sensed by performing a second sensing operation, and sensed data are output. MSB data of the TLCs may be combined using the data output as the result obtained by performing the first sensing operation and the second sensing operation.

Figure 11:
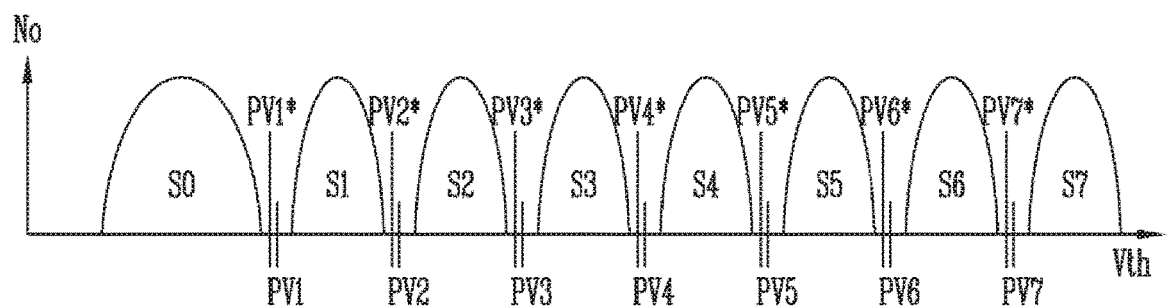
FIG. 11 is a threshold voltage distribution diagram illustrating a program verify operation of a memory device according to an embodiment of the present disclosure.

FIG. 11 is a threshold voltage distribution diagram illustrating a program verify operation of a memory device according to an embodiment of the present disclosure.

In FIG. 11, a case where three program states are sensed using one program verify voltage will be described as an example.

A program verify operation is performed to check whether threshold voltages of memory cells have been programmed to a target verify level or more after a program voltage is applied in a program operation of the memory device. The program verify operation may include a pre-verify operation of determining whether the threshold voltages of the memory cells have been programmed higher than pre-verify levels PV1* to PV7* lower than target verify levels (e.g., PV1 to PV7) and a main verify operation of determining whether the threshold voltages of the memory cells have been programmed higher than the target verify levels (e.g., PV1 to PV7).

Referring to FIG. 11, a first sensing operation is performed by fixing the verify voltage in the pre-verify operation to PV1 and adjusting the voltage of the second sense signal SA_SENSE in a pre-evaluation operation to a voltage capable of distinguishing whether the threshold voltages of the memory cells are lower or higher than the pre-verify level PV1* and then applying the adjusted voltage. Subsequently, a second sensing operation is performed by adjusting the voltage of the second sense signal SA_SENSE in a post-evaluation operation to a voltage capable of distinguishing whether the threshold voltages of the memory cells are lower or higher than the target verify level PV1 and then applying the adjusted voltage. The result obtained by performing the pre-verify operation and the main verify operation on the memory cells can be obtained using data output as the result obtained by performing the first sensing operation and the second sensing operation.

As described in the program verify operation, the verify voltage is sequentially fixed to PV2 to PV7, and the first sensing operation and the second sensing operation are then performed, so that the pre-verify operation and the main verify operation on the memory cells can be performed.

Further, in the embodiment of the present disclosure, a case where the pre-verify operation and the main verify operation are performed by performing the first sensing operation and the second sensing operation is described as an example. However, one or more pre-verify operations having a verify voltage lower than that of the main verify operation may be performed by performing at least two sensing operations through the adjustment of the voltage of the second sense signal SA_SENSE.

Figure 12:
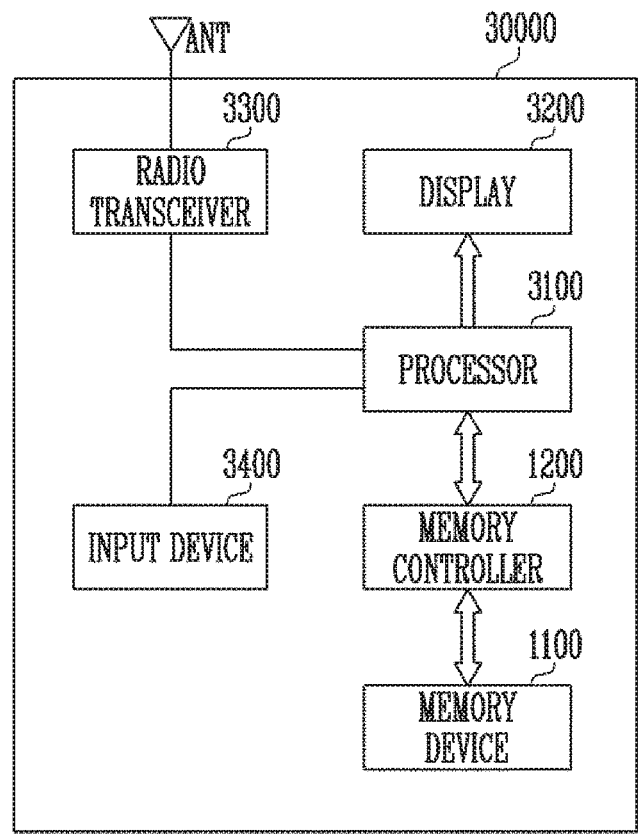
FIG. 12 is a diagram illustrating a memory system including a memory device according to an embodiment of the present disclosure.

FIG. 12 is a diagram illustrating a memory system according to an embodiment of the present disclosure, for example, a memory system 30000 including the memory device 1100 shown in FIG. 2.

Referring to FIG. 12, the memory system 30000 may be implemented as a cellular phone, a smart phone, a tablet PC, a personal digital assistant (PDA), or a wireless communication device. The memory system 30000 may include the memory device 1100 and a memory controller 1200 capable of controlling an operation of the memory device 1100. The memory controller 1200 may control a data access operation of the memory device 1100, e.g., a program operation, an erase operation, a read operation, or the like under the control of a processor 3100.

Data programmed in the memory device 1100 may be output through a display 3200 under the control of the memory controller 1200.

A radio transceiver 3300 may transmit and/or receive radio signals through an antenna ANT. For example, the radio transceiver 3300 may convert a radio signal received through the antenna ANT into a signal that can be processed by the processor 3100. Therefore, the processor 3100 may process a signal output from the radio transceiver 3300 and transmit the processed signal to the memory controller 1200 or the display 3200. The memory controller 1200 may transmit the signal processed by the processor 3100 to the memory device 1100. Also, the radio transceiver 3300 may convert a signal output from the processor 3100 into a radio signal, and output the converted radio signal to an external device through the antenna ANT. An input device 3400 is a device capable of inputting a control signal for controlling an operation of the processor 3100 or data to be processed by the processor 3100, and may be implemented as a pointing device such as a touch pad or a computer mount, a keypad, or a keyboard. The processor 3100 may control an operation of the display 3200 such that data output from the memory controller 1200, data output from the radio transceiver 3300, or data output from the input device 3400 can be output through the display 3200.

In some embodiments, the memory controller 1200 capable of controlling an operation of the memory device 1100 may be implemented as a part of the processor 3100, or be implemented as a chip separate from the processor 3100.

Figure 13:
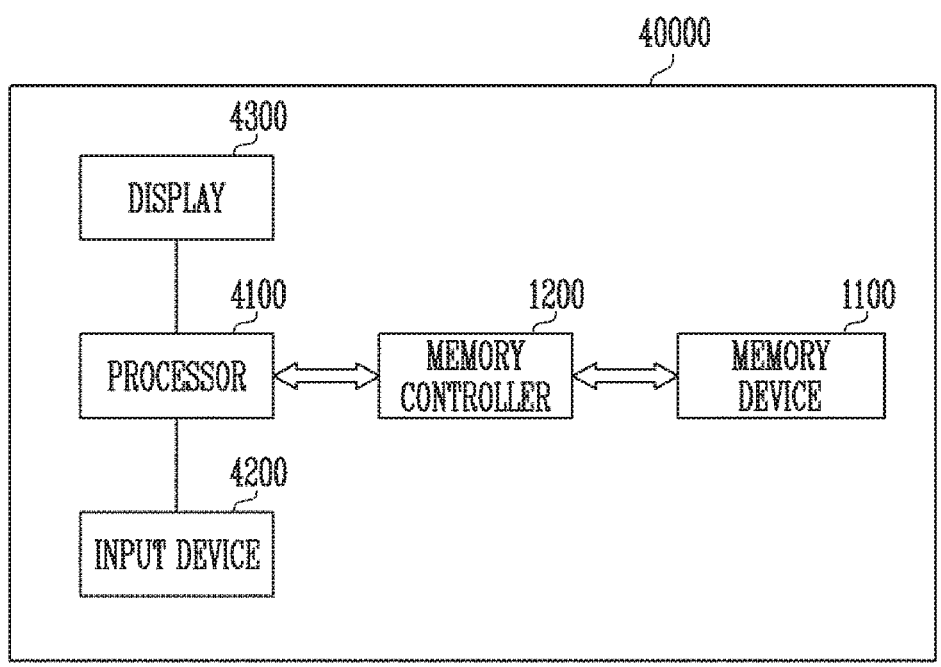
FIG. 13 is a diagram illustrating a memory system including a memory device according to an embodiment of the present disclosure.

FIG. 13 is a diagram illustrating a memory system according to an embodiment of the present disclosure, for example, a memory system 40000 including the memory device 1100 shown in FIG. 2.

Referring to FIG. 13, the memory system 40000 may be implemented as a personal computer (PC), a tablet PC, a net-book, an e-reader, a personal digital assistant (PDA), a portable multimedia player (PMP), an MP3 player, or an MP4 player.

The memory system 40000 may include the memory device 1100 and a memory controller 1200 capable of controlling a data processing operation of the memory device 1100.

A processor 4100 may output data stored in the memory device 1100 through a display 4300 according to data input through an input device 4200. For example, the input device 4200 may be implemented as a pointing device such as a touch pad or a computer mouse, a keypad, or a keyboard.

The processor 4100 may control overall operations of the memory system 40000, and control an operation of the memory controller 1200. In some embodiments, the memory controller 1200 capable of controlling an operation of the memory device 1100 may be implemented as a part of the processor 4100, or be implemented as a chip separate from the processor 4100.

Figure 14:
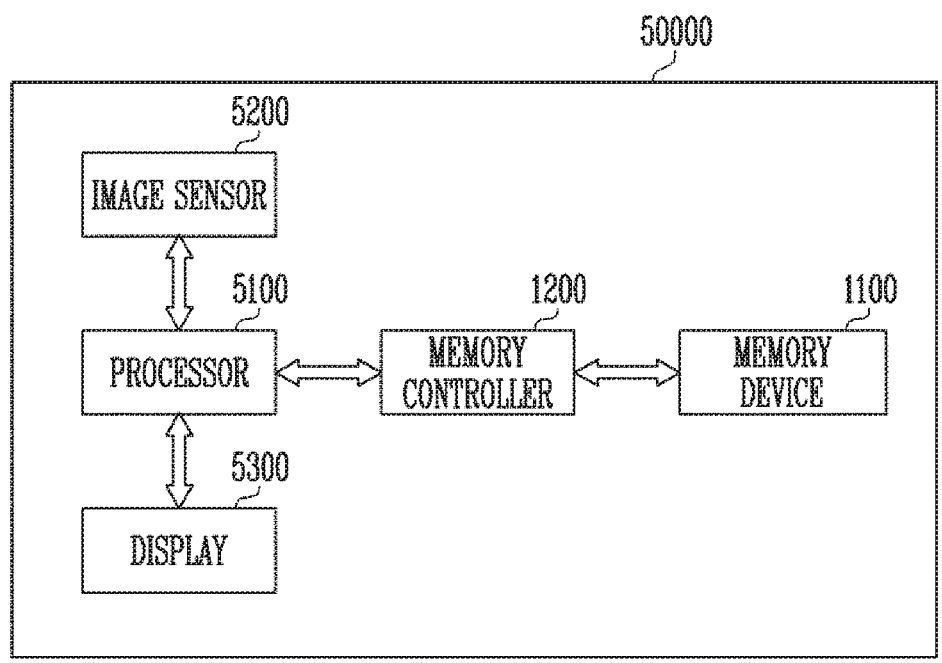
FIG. 14 is a diagram illustrating a memory system including a memory device according to an embodiment of the present disclosure.

FIG. 14 is a diagram illustrating a memory system according to an embodiment of the present disclosure, for example, a memory system 50000 including the memory device 1100 shown in FIG. 2.

Referring to FIG. 14, the memory system 50000 may be implemented as an image processing device, e.g., a digital camera, a mobile terminal having a digital camera attached thereto, a smart phone having a digital camera attached thereto, or a tablet personal computer (PC) having a digital camera attached thereto.

The memory system 50000 may include the memory device 1100 and a memory controller 1200 capable of controlling a data processing operation of the memory device 1100, e.g., a program operation, an erase operation, or a read operation.

An image sensor 5200 of the memory system 50000 may convert an optical image into digital signals, and the converted digital signals may be transmitted to a processor 5100 or the memory controller 1200. Under the control of the processor 5100, the converted digital signals may be output through a display 5300, or be stored in the memory device 1100 through the memory controller 1200. In addition, data stored in the memory device 1100 may be output through the display 5300 under the control of the processor 5100 or the memory controller 1200.

In some embodiments, the memory controller 1200 capable of controlling an operation of the memory device 1100 may be implemented as a part of the processor 5100, or be implemented as a chip separate from the processor 5100.

Figure 15:
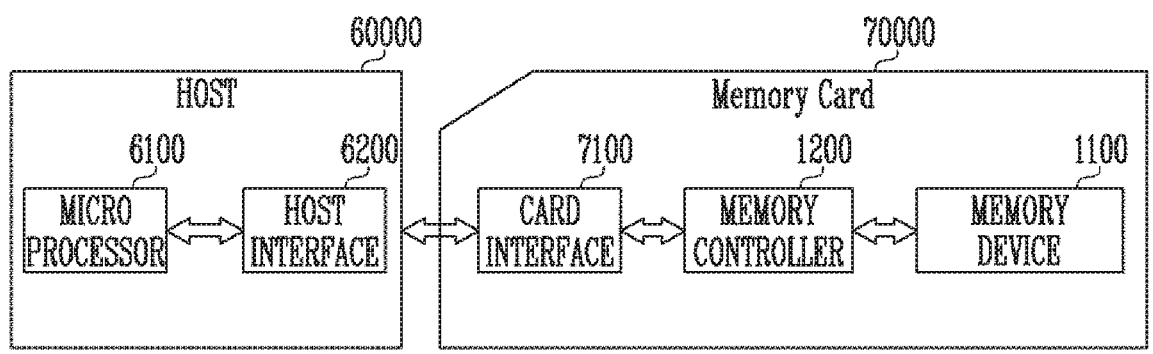
FIG. 15 is a diagram illustrating a memory system including a memory device according to an embodiment of the present disclosure.

FIG. 15 is a diagram illustrating a memory system according to an embodiment of the present disclosure, for example, a memory system 70000 including the memory device 1100 shown in FIG. 2.

Referring to FIG. 15, the memory system 70000 may be implemented as a memory card or a smart card. The memory system 70000 may include the memory device 1100, a memory controller 1200, and a card interface 7100.

The memory controller 1200 may control data exchange between the memory device 1100 and the card interface 7100. In some embodiments, the card interface 7100 may be a secure digital (SD) card interface or a multi-media card (MMC) interface, but the present disclosure is not limited thereto.

The card interface 7100 may interface data exchange between a host 60000 and the memory controller 1200 according to a protocol of the host 60000. In some embodiments, the card interface 7100 may support a universal serial bus (USB) protocol and an inter-chip (IC)-USB protocol. The card interface 7100 may mean hardware capable of supporting a protocol used by the host 60000, software embedded in the hardware, or a signal transmission scheme.

When the memory system 70000 is coupled to a host interface 6200 of the host 60000 such as a personal computer (PC), a tablet PC, a digital camera, a digital audio player, a cellular phone, console video game hardware, or a digital set-top box, the host interface 6200 may perform data communication with the memory device 1100 through the card interface 7100 and the memory controller 1200 under the control of a microprocessor 6100.

According to the present disclosure, a plurality of program states are sensed using one read voltage or program verify voltage in a read operation or program verify operation of the memory device, thereby improving the speed of the read operation and the program verify operation.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present disclosure as set forth in the following claims.

What is claimed is:

1. A memory device comprising:
a memory cell;
a bit line and a word line, coupled to the memory cell; and
a page buffer configured to perform a read operation on the memory cell,
wherein the page buffer senses a program state of the memory cell as one of at least three program states by performing a first evaluation operation, a first sensing operation, a second evaluation operation, and a second sensing operation when one read voltage is applied to the word line during the read operation,
wherein after the first sensing operation is performed, a precharge time of the bit line and the word line is skipped, and
wherein the second sensing operation is performed without additionally precharging the bit line and the word line.

2. The memory device of claim 1, wherein the at least three program states are a first program state having a first threshold voltage higher than the read voltage, a second program state having a second threshold voltage that is lower than the read voltage but is adjacent to the read voltage, and a third program state having a third threshold voltage lower than the second threshold voltage.

3. The memory device of claim 2, wherein, in the first evaluation operation, it is determined that the memory cell is in the third program state or the first and second program states.

4. The memory device of claim 2, wherein, in the second evaluation operation, it is determined that the memory cell is in the first program state or the second program state.

5. The memory device of claim 1, wherein the page buffer includes:
a first transistor coupled between the bit line and a common node, the first transistor being controlled by a first sense signal;
a second transistor coupled between the common node and a sense node, the second transistor being controlled by a second sense signal;
a storage configured to latch data corresponding to a potential level of the sense node; and
third and fourth transistors coupled in series between a power voltage and the common node, the third and fourth transistors being controlled by a potential level of a first node of the storage and a precharge signal.

6. The memory device of claim 5, wherein, in the first evaluation operation, the first sense signal is applied with a first potential level, and the second sense signal is applied with a second potential level that is lower than the first potential level by a first set value.

7. The memory device of claim 6, wherein, in the second evaluation operation, the first sense signal is applied with the first potential level, and the second sense signal is applied with a third potential level that is higher than the second potential level by a second set value.

8. The memory device of claim 7, wherein the second set value is smaller than the first set value.

9. The memory device of claim 7, wherein the third potential level is lower than the first potential level.

10. A method for operating a memory device, the method comprising:
precharging a bit line coupled to a memory cell, and applying a first read voltage to a word line coupled to the memory cell;
performing a pre-evaluation operation by controlling a potential level of a sense node in a page buffer according to a potential level of the bit line, wherein potentials of the bit line and a common node are evaluated in response to a first sensing signal having a first potential level, and potentials of the common node and the sense node are evaluated in response to a second sensing signal having a second potential level;

performing a first sensing operation by sensing first data corresponding to the potential level of the sense node;

performing a post-evaluation operation by maintaining the first read voltage applied to the word line, and controlling the potential level of the sense node according to the potential level of the bit line, wherein the potentials of the bit line and the common node are evaluated in response to the first sensing signal having the first potential level, and the potentials of the common node and the sense node are evaluated in response to the second sensing signal having a third potential level; and performing a second sensing operation by sensing second data corresponding to the potential level of the sense node, wherein after the first sensing operation is performed, a precharge time of the bit line and the word line is skipped, and wherein the second sensing operation is performed without additionally precharging the bit line and the word line.

11. The method of claim 10, wherein the first potential level is higher than the second potential level and the third potential level.

12. The method of claim 10, wherein the second potential level is lower than the first potential level by a first set voltage value, and the third potential level is higher than the second potential level by a second set voltage value.

13. The method of claim 12, wherein the first set voltage value is larger than the second set voltage value.

14. The method of claim 10, wherein performing of the pre-evaluation operation comprises:

evaluating the sense node to a first level when the memory cell is in a first program state having a first threshold voltage higher than the first read voltage or a second program state having a second threshold voltage that is lower than the first read voltage but is adjacent to the first read voltage; and evaluating the sense node to a second level different from the first level when the memory cell is in a third program state having a third threshold voltage lower than the second threshold voltage.

15. The method of claim 14, wherein performing of the post-evaluation operation comprises:

evaluating the sense node to the first level when the memory cell is in a first program state; and evaluating the sense node to the second level when the memory cell is in a second program state.

16. The method of claim 10, further comprising precharging the sense node before the post-evaluation operation is performed after the first sensing operation is performed.

17. A method for operating a memory device, the method comprising:

precharging a bit line coupled to a memory cell, and applying a main verify voltage to a word line coupled to the memory cell;

performing a pre-evaluation operation by controlling a potential level of a sense node in a page buffer according to a potential level of the bit line, wherein potentials of the bit line and a common node are evaluated in response to a first sensing signal having a first potential level, and potentials of the common node and the sense node are evaluated in response to a second sensing signal having a second potential level;

performing a pre-verify operation according to the potential level of the sense node by performing a first sensing operation;

performing a post-evaluation operation by maintaining the main verify voltage applied to the word line, and controlling the potential level of the sense node according to the potential level of the bit line, wherein the potentials of the bit line and the common node are evaluated in response to the first sensing signal having the first potential level, and the potentials of the common node and the sense node are evaluated in response to the second sensing signal having a third potential level; and performing a main verify operation according to the potential level of the sense node by performing a second sensing operation, wherein after the pre-verify operation is performed, a precharge time of the bit line and the word line is skipped, and wherein the main verify operation is performed without additionally precharging the bit line and the word line.

18. The method of claim 17, wherein performing of the pre-verify operation comprises verifying whether a threshold voltage of the memory cell is higher or lower than a pre-verify level, and the pre-verify level is lower than the main verify voltage.

19. The method of claim 17, wherein performing of the main verify operation comprising verifying whether a threshold voltage of the memory cell is higher or lower than a main verify level, and the main verify level is equal to the main verify voltage.

20. The method of claim 17, wherein the first potential level is higher than the second potential level and the third potential level.

21. The memory device of claim 1, wherein voltage levels applied to a gate of a second transistor coupled between a common node and the sense node in the first evaluation operation and the second evaluation operation are different from a voltage level for precharging the bit line.

22. The method of claim 10, wherein voltage levels applied to a gate of a second transistor coupled between the common node and the sense node in the pre-evaluation operation and the post-evaluation operation are different from a voltage level for precharging the bit line.

23. The method of claim 17, wherein voltage levels applied to a gate of a second transistor coupled between the common node and the sense node in the pre-verify operation and the main verify operation are different from a voltage level for precharging the bit line.

* * * * *